US009202863B2

(12) United States Patent
Edelstein et al.

(10) Patent No.: US 9,202,863 B2
(45) Date of Patent: Dec. 1, 2015

(54) STRUCTURE WITH SELF ALIGNED RESIST LAYER ON AN INTERCONNECT SURFACE AND METHOD OF MAKING SAME

(71) Applicant: INTERNATIONAL BUSINESS MACHINES CORPORATION, Armonk, NY (US)

(72) Inventors: Daniel C. Edelstein, White Plains, NY (US); Elbert E. Huang, Carmel, NY (US); Robert D. Miller, San Jose, CA (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 37 days.

(21) Appl. No.: 13/826,936

(22) Filed: Mar. 14, 2013

(65) Prior Publication Data

US 2013/0193551 A1 Aug. 1, 2013

Related U.S. Application Data

(60) Continuation of application No. 13/418,818, filed on Mar. 13, 2012, now Pat. No. 8,461,678, which is a division of application No. 12/356,105, filed on Jan. 20, 2009, now Pat. No. 8,227,336.

(51) Int. Cl.
*H01L 23/48* (2006.01)
*H01L 23/52* (2006.01)
(Continued)

(52) U.S. Cl.
CPC .............. *H01L 29/0649* (2013.01); *G03F 7/00* (2013.01); *G03F 7/2022* (2013.01); *H01L 21/0271* (2013.01); *H01L 21/31144* (2013.01); *H01L 21/7682* (2013.01); *H01L 21/76826* (2013.01); *H01L 21/76834* (2013.01); *H01L 21/76883* (2013.01); *H01L 23/5222* (2013.01); *H01L 23/53295* (2013.01); *H01L 23/53238* (2013.01); *H01L 2924/0002* (2013.01)

(58) Field of Classification Search
CPC ......................... H01L 21/7682; H01L 29/0649
USPC .......... 257/E21.581, 522, 735, 758, 760, 773, 257/E23.142; 216/13, 17, 41, 49; 430/311, 430/313, 317
See application file for complete search history.

(56) References Cited

U.S. PATENT DOCUMENTS

| | | | |
|---|---|---|---|
| 4,770,974 A * | 9/1988 | Hiraoka | 430/270.1 |
| 5,945,250 A | 8/1999 | Aoai et al. | |
| 6,642,147 B2 | 11/2003 | Dokumaci et al. | |
| 7,361,991 B2 * | 4/2008 | Saenger et al. | 257/750 |
| 8,461,678 B2 * | 6/2013 | Edelstein et al. | 257/735 |
| 2004/0127001 A1 | 7/2004 | Colburn et al. | |
| 2004/0137241 A1 * | 7/2004 | Lin et al. | 428/447 |

(Continued)

FOREIGN PATENT DOCUMENTS

JP   2264259 A   10/1990

*Primary Examiner* — Meiya Li
*Assistant Examiner* — Peter M Abrecht
(74) *Attorney, Agent, or Firm* — Andrew M. Calderon; Roberts Mlotkowski Safran & Cole, P.C.

(57) ABSTRACT

A structure is provided with a self-aligned resist layer on a surface of metal interconnects for use in forming air gaps in an insulator material and method of fabricating the same. The non-lithographic method includes applying a resist on a structure which has at least one metal interconnect formed in an insulator material. The method further includes blanket-exposing the resist to energy and developing the resist to expose surfaces of the insulator material while protecting the metal interconnects. The method further includes forming air gaps in the insulator material by an etching process, while the metal interconnects remain protected by the resist.

11 Claims, 6 Drawing Sheets

(51) Int. Cl.
    *H01L 29/40*      (2006.01)
    *H01L 29/06*      (2006.01)
    *G03F 7/00*       (2006.01)
    *G03F 7/20*       (2006.01)
    *H01L 21/027*     (2006.01)
    *H01L 21/311*     (2006.01)
    *H01L 21/768*     (2006.01)
    *H01L 23/522*     (2006.01)
    *H01L 23/532*     (2006.01)

(56) References Cited

U.S. PATENT DOCUMENTS

| | | |
|---|---|---|
| 2004/0150096 A1 | 8/2004 | Purushothaman et al. |
| 2004/0266169 A1* | 12/2004 | Sakata ............ 438/622 |
| 2005/0167838 A1* | 8/2005 | Edelstein et al. ......... 257/758 |
| 2005/0208430 A1 | 9/2005 | Colburn et al. |
| 2007/0096319 A1* | 5/2007 | Hsu et al. ............ 257/750 |
| 2008/0220615 A1 | 9/2008 | Brunner et al. |

* cited by examiner

STRUCTURE WITH SELF ALIGNED RESIST LAYER ON AN INTERCONNECT SURFACE AND METHOD OF MAKING SAME

FIELD OF THE INVENTION

The present invention relates generally to an interconnect structure and method of fabricating the same and, more particularly, to a structure with a self-aligned resist layer on a surface of the interconnects for use in forming dielectric sub-structures such as air gaps in an insulator material between the interconnects, and method of fabricating the same.

BACKGROUND

To fabricate microelectronic semiconductor devices such as an integrated circuit (IC), many different layers of metal interconnects and their surrounding insulation are deposited and patterned above the transistor layer on a silicon wafer. The insulation layers may be, for example, silicon dioxide, silicon oxynitride, fluorinated silicate glass (FSG), organosilicate glass (OSG, SiCOH), and the like. These insulation layers are deposited between the metal interconnect layers, i.e., interlevel dielectric (ILD) layers, and may act as electrical insulation therebetween.

The metal interconnect layers are interconnected by metallization through vias etched in the intervening insulation layers. Additionally, interconnects are provided separately within the dielectric (insulation) layers. To accomplish this, the stacked layers of metal and insulation undergo photolithographic processing to provide a pattern consistent with a predetermined IC design. By way of example, the top layer of the structure may be covered with a photo resist layer of photo-reactive polymeric material for patterning via a mask. A photolithographic process using either visible or ultraviolet light is then directed through the mask onto the photo resist layer to expose it in the mask pattern. An antireflective coating (ARC) layer may be provided at the top portion of the wafer substrate to minimize reflection of light back to the photo resist layer for more uniform processing. Regardless of the fabrication process, to maximize the integration of the device components in very large scale integration (VLSI), it is necessary to increase the density of the components.

Although silicon dioxide material has been used as an insulating material due to its thermal stability and mechanical strength, in recent years it has been found that better device performance may be achieved by using a lower dielectric constant material. By using a lower dielectric constant insulator material, a reduction in the capacitance of the structure can be achieved which, in turn, increases the device speed. However, use of organic low-k dielectric material such as, for example, SiCOH, tends to have lower mechanical strength than conventional dielectric materials such as, for example, silicon oxide.

By building a device having a low-k dielectric or a hybrid low-k dielectric stack, the large intra-level line-to-line component of wiring capacitive coupling is reduced, thus maximizing the positive benefit of the low-k material while improving the overall robustness and reliability of the finished structure. The hybrid oxide/low-k dielectric stack structure is much more robust than an "alllow-k" dielectric stack, but with a concomitant increase in wiring capacitance relative to the alllow-k stack. As insulator dielectric constants continue to be decreased, for example by adding porosity to the low-k material such as SiCOH, the overall dielectric mechanical strength continues to decrease as well.

Nonetheless, even with the lower dielectric constant materials including, for example, a hybrid oxide/low-k dielectric stack structure, there is still the possibility to improve even further the electrical propel lies of the device by lowering the effective K (Kerf) of a multilevel structure or a K of the dielectric material by forming voided channels (conventionally referred to as "air gaps", though they may not contain air) within the dielectric material between the interconnects and vias. The channels are vacuum filled and have a dielectric constant of about 1.0, and represent a dielectric sub-structure between the metal interconnects in the IC. By using such channels, the Keff of a higher dielectric constant insulator may be lowered significantly without reducing its mechanical strength by nearly as much.

There may be additional reasons for creating other types of dielectric sub-structures between the metal interconnects. For example, porous ultralow-k insulator surfaces may need to be strengthened or repaired after chemical-mechanical polishing or plasma precleans prior to cap depositions, to improve their time dependent dielectric breakdown (TDDB) reliability. Similar to the air gap process, this might require sub-lithographic patterning to define regions where sub-structure processes are effective.

In known systems, sub-resolution lithography processes have been used to create such channels. This typically consists of new manufacturing processes and tool sets which add to the overall cost of the fabrication of the semiconductor device. Also, in sub-resolution lithography processes, it is necessary to etch wide troughs in empty spaces which, in turn, cannot be pinched off by ILD PECVD deposition. Additionally, although the channels create low line-line capacitance, there remains a high level-level capacitance for wide lines. This, of course, affects the overall electrical properties of the device. Also, air gaps can occur near the vias from a higher level which creates the risk of plating bath or metal fill at these areas. Lastly, in known processes, there is also the requirement of providing an isotropic etch which may etch underneath the interconnect thus leaving it unsupported or floating and, thus degrading the entire structural and electrical performance of the device.

Accordingly, there exists a need in the art to overcome the deficiencies and limitations described hereinabove.

SUMMARY

In a first aspect of the invention a non-lithographic method comprises applying a resist on a structure comprising at least one of interconnects formed in an insulator material. The method further includes blanket-exposing the resist to energy and developing the resist to expose surfaces of the insulator material while protecting the interconnects. The method further includes forming air gaps in the insulator material by an etching process, while the interconnects remain protected by the resist.

In another aspect of the invention, a non-lithographic method comprises forming interconnect structures in a dielectric layer; forming a layer of negative tone resist on exposed surfaces of the interconnect structures and the dielectric layer; blanket-exposing the negative tone resist to energy; developing the negative tone resist to expose the surface of the dielectric layer while maintaining a protective layer on the surface of the interconnect structures; etching air gaps into the dielectric layer, while protecting the interconnect structures; and removing the negative tone resist from the interconnect structures.

In another aspect of the invention, an intermediate structure comprises a dielectric layer having air gaps between interconnect structures. The structure also includes a layer of negative tone spin-on organic polymer having a photoacid generator on exposed surfaces of the interconnect structures. The photoacid generator leads to the negative tone spin-on organic polymer being selectively removed over the dielectric layer after exposure to energy. A capping material pinches off a perforated hard mask layer over the polymer layer.

In yet another aspect of the invention, a structure comprises a dielectric layer having gaps between metal interconnect structures and a layer of polymer having a photoacid generator on exposed surfaces of the metal interconnect structures. The structure also includes a pinched off perforated hard mask layer over the polymer layer.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention, in which.

DETAILED DESCRIPTION

The present invention relates generally to an interconnect structure and method of fabricating the same and, more particularly, to a structure with a self-aligned resist layer on a surface of the interconnects for use in forming air gaps in an insulator material and method of fabricating the same. In implementing the fabrication processes and structures in accordance with the invention, a self-aligned resist material is deposited on interconnects and/or other wires within the structure. The self-aligned resist material protects the interconnects during the formation of air gaps within the insulator material. The air gaps effectively increase the insulative properties of the insulator material.

First Aspect of the Invention

Figure 1:
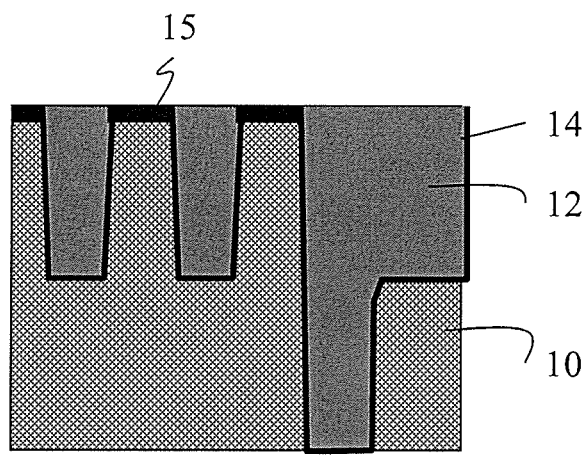
FIGS. 1-5 show intermediate structures and respective fabrication processes in accordance with a first aspect of the invention.

FIGS. 1-5 show intermediate structures and respective fabrication processes in accordance with a first aspect of the invention. In particular, FIG. 1 shows a structure comprising interconnects (generally depicted as reference numeral 12) embedded within a dielectric (insulator) layer 10. In embodiments, the dielectric material 10 is $SiO_2$, low-k SiCOH, ultralow-k porous SiCOH, or other dielectric material. In optional embodiments, a hard dielectric layer (hard mask) 15 may be deposited and polished on the insulator material 10.

In embodiments, the interconnects 12 may be copper, lined with another metal 14 such as, for example, TaN or Ta. The interconnects 12 may be formed using conventional dual damascene fabrication processes such that further explanation is not required herein for an understanding of the invention.

Figure 2:
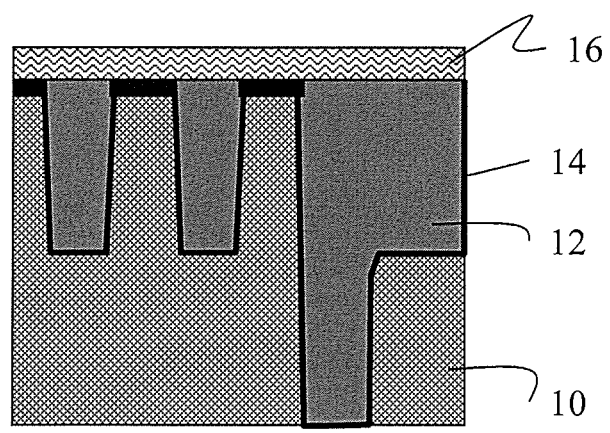

In FIG. 2, a capping resist layer 16 is applied to the structure of FIG. 1. In particular, the capping resist layer 16 may be a spin-on self-aligning resist layer such as, for example, an organic polymer. In embodiments, the capping resist layer 16 is a class of organic photoresist materials containing iodonium salts, which possesses a Cu-catalyzed decomposition property.

In more particular embodiments, the capping resist layer 16 functions as a negative tone non-lithographic selective cap. Non-lithographic is required for absolute alignment, in the presence of overlay and dimensional control variations, such that the interconnects 12 remain capped and the surfaces of the hard mask 15 are exposed in subsequent processes. In embodiments, the entire surface of all the interconnects 12 remain capped in order to protect the interconnects during the formation of subsequent air gaps in the insulator layer 10. The capping resist layer 16 may range in thickness from about 20 nm to 500 nm.

In more particular embodiments, the organic photoresist materials can include a photoacid generator (PAG) which can turn a material into either a negative or positive variety. In the embodiment described herein, the PAG leads to the capping resist layer 16 being selectively removed over the insulator material 10 after exposure to energy. For such resist systems, the decomposition of the iodonium sensitizer produces acid. This acid is used to activate the resist upon thermal heating which, in turn, prevents development of the resist. The most common reaction would be cleavage of a t-butyl ester to produce a carboxlyic acid, which would be soluble in base. Alternatively a material like S-cap would liberate the free phenolic group, also soluble in base.

Figure 3:
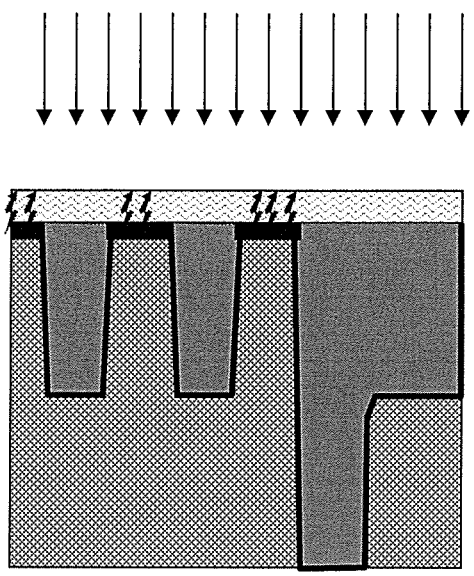

As shown in FIG. 3, the capping resist layer 16 is exposed to energy (e.g., thermal, optical, e-beam) to induce an activation of the capping resist layer 16 by acid generation, ring-breaking, or other mechanism. For example, the capping resist layer 16 can be flood-exposed to UV or DUV optical radiation. This will polymerize the capping resist layer 16 over the Cu regions so that it can be developed off of the insulator regions 10. In the case of PAG, mild heating will induce the self-aligned catalyzed activation. The amount of heat needed depends on the protecting group, as should be understood by those of skill in the art.

Figure 4:
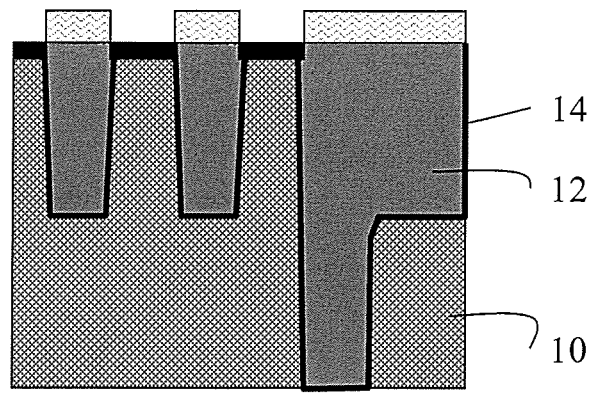

In FIG. 4, the capping resist layer 16 is developed and, if necessary, baked, using conventional processes. This results in the capping resist layer 16 selectively being removed from the exposed surface of the insulator layer 10 and remaining on the metal surfaces of the interconnects 12. The capping resist layer 16 protects the interconnects 12 during subsequent etching processes.

Figure 5:
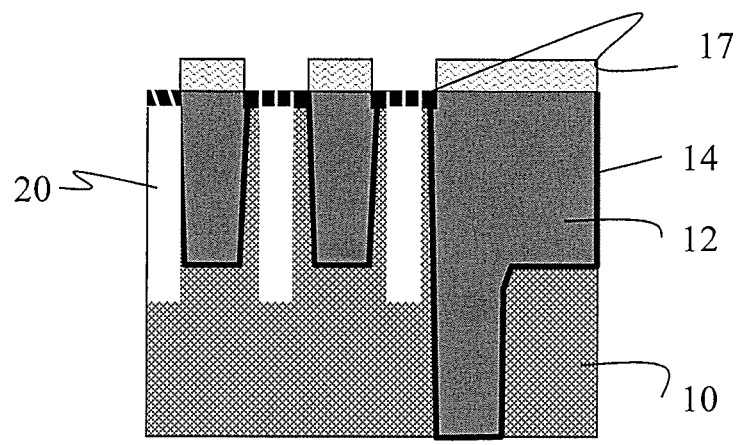

In FIG. 5, perforations 17 are etched in the hard mask 15. To form the perforations, for example, a block copolymer nanotemplate can be formed over the hard mask 15. The block copolymer nanotemplate is a thin layer having features smaller than the minimal resolution features, e.g., the features of the block copolymer nanotemplate are smaller than the spacing between the interconnects 12. The block copolymer nanotemplate may be a material that self assembles into substantially uniformly shaped and spaced holes or features. For example, the block copolymer nanotemplate may be a self-assembled monolayer templated porous or permeable film. The block copolymer nanotemplate may be e-beam, "uv" or thermally cured. An etching process is then performed to produce perforations in the hard mask 15. Further etching results in the formation of air gaps 20 in the insulator material. (See, for example, U.S. Publication No. 2008/0026541, the contents of which are incorporated by reference herein in its entirety.)

In embodiments, air gaps 20 can be formed directly in the insulator layer 10 without the need for a hard mask. The air gaps 20 can be formed using any conventional etching process such as, for example, a RIE.

Figure 6:
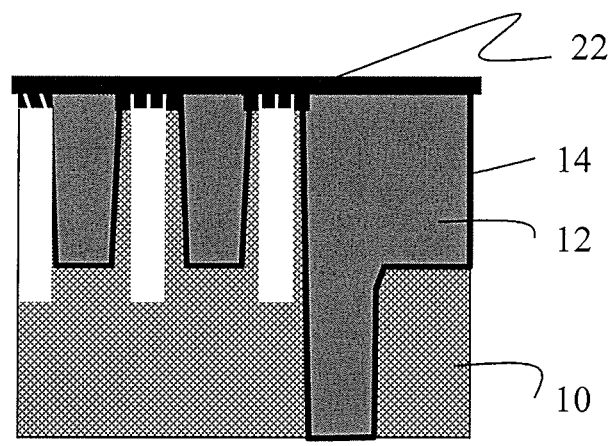
FIG. 6 shows a final structure and accompanying fabrication processes in accordance with the first aspect of the invention.

FIG. 6 shows a final structure and respective fabrication processes in accordance with the invention. As shown in FIG. 6, the capping resist layer 16 is removed by a solvent or ashing process, e.g., stripping or lifting off the capping resist layer 16. A capping layer 22 is deposited on the structure, which pinches off the perforations formed in the hard mask 15. In embodiments, the capping layer 22 is a SiCNH cap.

Second Aspect of the Invention

Figure 7:
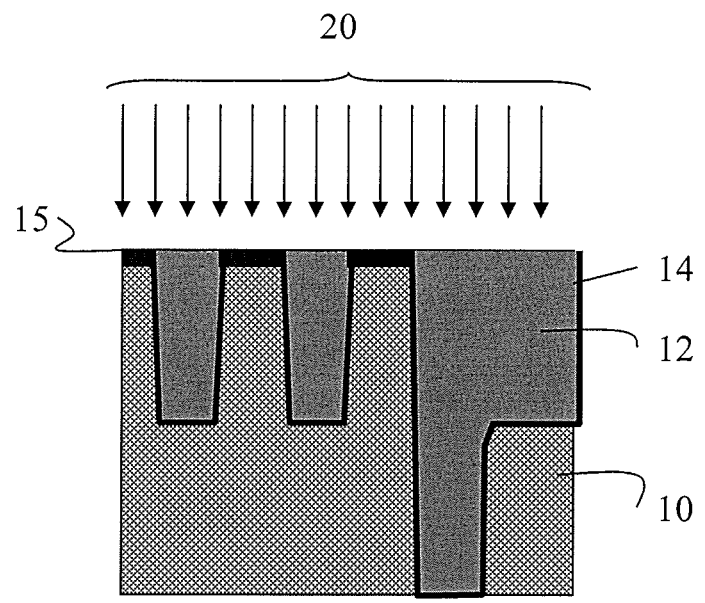
FIGS. 7-11 show intermediate structures and respective fabrication processes in accordance with a second aspect of the invention.

FIGS. 7-11 show intermediate structures and respective fabrication processes in accordance with a second aspect of the invention. In particular, FIG. 7 shows a structure comprising interconnects 12 embedded within a dielectric (insulator) layer 10. In embodiments, the dielectric material 10 is SiO2 or low-k SiCOH dielectric material. In embodiments, the interconnects 12 may be copper lined with another metal 14 such as, for example, TaN or Ta. The interconnects 12 may be formed using conventional dual damascene fabrication processes. In embodiments, a hard dielectric layer (hard mask) 15 may be deposited and polished on the insulator material 10.

In FIG. 7, a diffuse poisoning agent 20 is applied to the structure and preferentially the interconnects 12. In embodiments, the poisoning agent may be, for example, $NH_3$ or an amine gas or plasma. In embodiments, the poisoning agent 20 is designed to remain on the exposed metal surfaces of the interconnects 12 to ensure that a subsequently applied resist layer remains on the surface of the interconnects 12 when exposed to, for example, UV. In embodiments, the poisoning agent 20 is applied as $NH_3$, $N_2/H_2$ (forming gas), or other amine-producing gas or plasma to wafers at room temperature or elevated temperature up to approximately 400° C. in a vacuum chamber. For example, typical PECVD chambers with standard $NH_3/N_2$ plasma preclean capability may be used.

Figure 8:
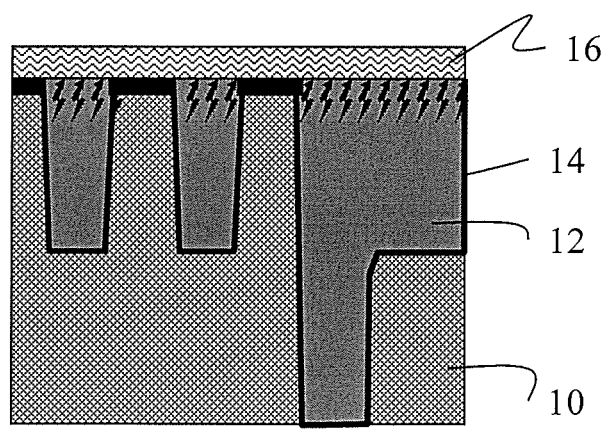

In FIG. 8, the capping resist layer 16 is applied to the structure of FIG. 7. In particular, the capping resist layer 16 may be a spin-on self-aligning resist layer such as, for example, an organic polymer. In embodiments, the capping resist layer 16 is a class of organic photoresist materials containing iodonium salts. In embodiments, the capping resist layer 16 possesses a catalyzed decomposition property. In more particular embodiments, the capping resist layer 16 is a negative tone poison non-lithographic selective cap. The capping resist layer 16 may range in thickness from about 20 nm to 500 nm.

Figure 9:
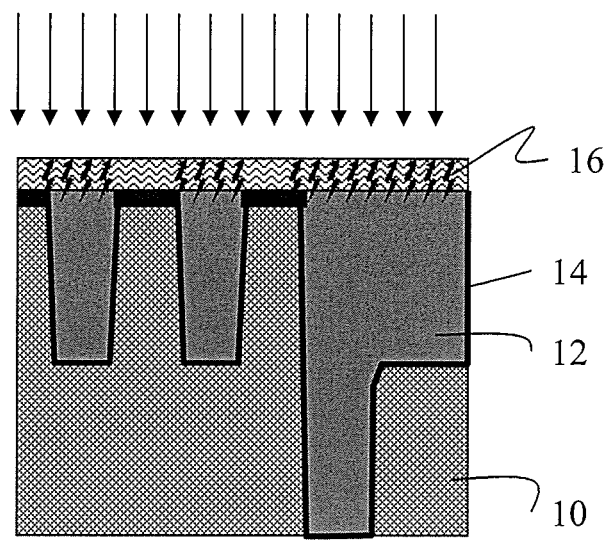

As shown in FIG. 9, the capping resist layer 16 is exposed to energy (e.g., thermal, optical, e-beam) to induce a self-aligned catalyzed activation of the capping resist layer 16 by acid generation, ring-breaking, or other mechanism. For example, the capping resist layer 16 can be flood-exposed to UV or DUV optical radiation. This will induce self-aligned poisoning of the capping resist layer 16, e.g., cause a chemical reaction of the poisoning on the exposed surface of the metal interconnect 12. Typical exposures could be 100 C thermal bake for several minutes, or blanket DUV flood exposure at 193 nm wavelength at a dose of ~20 to ~100 $mJ/cm^2$. In embodiments, in this process, the entire surface of insulator layer 10 is exposed; whereas, the interconnects 12 will remain capped to thereby protect the interconnects 12 during subsequent etching processes.

Figure 10:
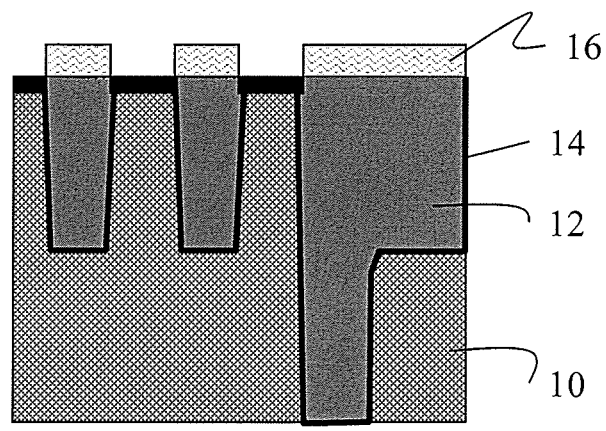

In FIG. 10, the capping resist layer 16 is developed and, if necessary, baked, using conventional processes. This results in the capping resist layer 16 being selectively removed from the surface of the insulator layer 10 and remaining on the metal surfaces of the interconnects 12.

Figure 11:
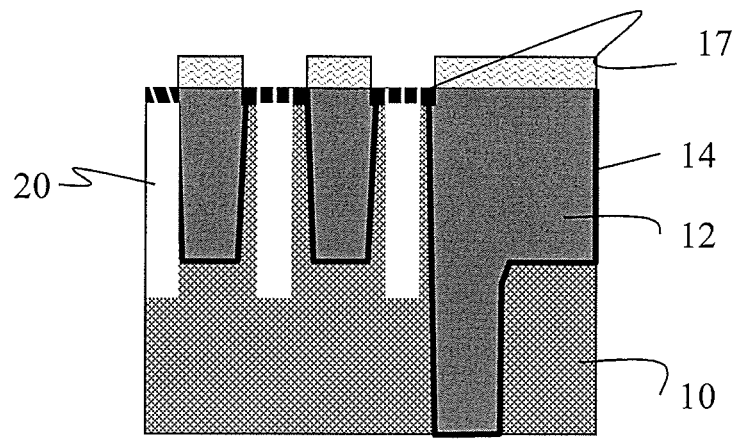

In FIG. 11, perforations 17 are etched in the hard mask 15 as discussed above. Also, air gaps 20 are formed in the insulator material 10.

Figure 12:
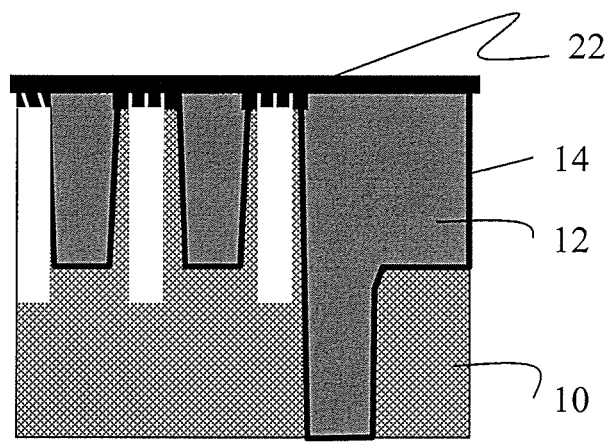
FIG. 12 shows a final structure and accompanying fabrication processes in accordance with the second aspect of the invention.

FIG. 12 shows a final structure and respective fabrication processes in accordance with the invention. As shown in FIG. 12, the capping resist layer 16 is removed by a solvent or ashing process, e.g., stripping or lifting off the capping resist layer 16. A capping layer 22 is deposited on the structure, which pinches off the perforations formed in the hard mask 15. In embodiments, the capping layer 22 is a SiCNH cap.

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with the structures of the invention) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. An intermediate structure, comprising:
a perforated mask layer,
wherein the perforated mask layer is positioned over air gaps formed in a substrate, the air gaps being located between metal interconnect structures formed in the substrate, the perforated mask layer being formed adjacent to side edges of a layer of negative tone spin-on organic polymer which is on upper surfaces of the metal interconnect structures,
wherein the upper surfaces of the metal interconnect structures are devoid of the perforated mask layer, and
wherein upper surfaces of the perforated mask layer are substantially coplanar with the upper surfaces of the metal interconnect structures and a bottom surface of the layer of the negative tone spin-on organic polymer.

2. The intermediate structure of claim 1, wherein the layer of the negative tone spin-on organic polymer has a photoacid generator on the upper surfaces of the metal interconnect structures.

3. The intermediate structure of claim 1, wherein the layer of the negative tone spin-on organic polymer is a capping resist layer.

4. The intermediate structure of claim 1, wherein the metal interconnect structures are capped and the upper surfaces of the perforated mask layer are exposed.

5. The intermediate structure of claim 1, wherein the perforated mask layer is positioned on portions of the substrate and over the air gaps, and adjacent to the side edges of the layer of the negative tone spin-on organic polymer.

6. The intermediate structure of claim 5, wherein the layer of the negative tone spin-on organic polymer is directly on the upper surfaces of the metal interconnect structures.

7. An intermediate structure, comprising
a perforated mask layer,
wherein the perforated mask layer is positioned over air gaps formed in a substrate, the air gaps being located between metal interconnect structures formed in the substrate, the perforated mask layer being adjacent to side edges of a layer of spin-on organic polymer which is on upper surfaces of the metal interconnect structures,
wherein the upper surfaces of the metal interconnect structures are devoid of the perforated mask layer, and
wherein upper surfaces of the perforated mask layer are substantially coplanar with the upper surfaces of the metal interconnect structures and a bottom surface of the layer of the spin-on organic polymer.

8. The intermediate structure of claim 7, wherein:
the layer of the spin-on organic polymer comprises a layer of negative tone spin-on organic polymer;
the layer of the negative tone spin-on organic polymer is a capping resist layer;
the metal interconnect structures are capped and the upper surfaces of the perforated mask layer are exposed; and
the layer of the negative tone spin-on organic polymer is directly on the upper surfaces of the metal interconnect structures.

9. The intermediate structure of claim 8, wherein the perforated mask layer is positioned on portions of the substrate and over the air gaps, and adjacent to the side edges of the layer of the negative tone spin-on organic polymer.

10. The intermediate structure of claim 1, wherein the upper surfaces of the perforated mask layer are devoid of the layer of the negative tone spin-on organic polymer.

11. The intermediate structure of claim 7, wherein the upper surfaces of the perforated mask layer are devoid of the layer of the spin-on organic polymer.

* * * * *